(12) United States Patent
Shiono

(10) Patent No.: US 10,148,273 B2
(45) Date of Patent: Dec. 4, 2018

(54) PLL CIRCUIT, SEMICONDUCTOR DEVICE, ELECTRONIC CONTROL UNIT, AND CONTROL METHOD OF PLL CIRCUIT

(71) Applicant: Renesas Electronics Corporation, Tokyo (JP)

(72) Inventor: Masumi Shiono, Kodaira (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 208 days.

(21) Appl. No.: 15/217,785

(22) Filed: Jul. 22, 2016

(65) Prior Publication Data
US 2017/0059325 A1    Mar. 2, 2017

(30) Foreign Application Priority Data
Sep. 2, 2015   (JP) ................................ 2015-172628

(51) Int. Cl.
| | |
|---|---|
| *H03L 7/089* | (2006.01) |
| *H03L 7/08* | (2006.01) |
| *B60T 7/22* | (2006.01) |
| *B60T 8/171* | (2006.01) |
| *B60T 8/1755* | (2006.01) |

(52) U.S. Cl.
CPC ............ *H03L 7/089* (2013.01); *B60T 7/22* (2013.01); *B60T 8/171* (2013.01); *B60T 8/17551* (2013.01); *H03L 7/0805* (2013.01); *B60T 2201/024* (2013.01)

(58) Field of Classification Search
CPC ............................ H03L 7/089; H03L 7/0891
See application file for complete search history.

(56) References Cited

U.S. PATENT DOCUMENTS

| | | | | |
|---|---|---|---|---|
| 8,760,202 B1 * | 6/2014 | Sinha | ........................ | H03L 7/10 327/148 |
| 8,957,705 B2 * | 2/2015 | Jia | ........................ | G04F 10/005 327/12 |

FOREIGN PATENT DOCUMENTS

JP        2013-077966 A      4/2013

\* cited by examiner

*Primary Examiner* — Hai L Nguyen
(74) *Attorney, Agent, or Firm* — McGinn I.P. Law Group, PLLC.

(57) ABSTRACT

According to one embodiment, a PLL circuit includes: a digital phase comparator that captures an instantaneous value of a reference clock signal, which is a digital since wave, in synchronization with a feedback clock signal, and detects a phase difference between the reference clock signal and the feedback clock signal based on the captured instantaneous value; a control voltage generation unit that generates a control voltage according to the phase difference; a voltage control oscillator that generates an output clock signal having a frequency according to the control voltage; a frequency divider that divides a frequency of the output clock signal to generate the feedback clock signal; and a control unit that amplifies the reference clock signal to be supplied to the digital phase comparator with an amplification factor according to the phase difference.

20 Claims, 8 Drawing Sheets

PLL CIRCUIT, SEMICONDUCTOR DEVICE, ELECTRONIC CONTROL UNIT, AND CONTROL METHOD OF PLL CIRCUIT

CROSS-REFERENCE TO RELATED APPLICATIONS

This application is based upon and claims the benefit of priority from Japanese patent application No. 2015-172628, filed on Sep. 2, 2015, the disclosure of which is incorporated herein in its entirety by reference.

BACKGROUND

The present invention relates to a PLL circuit, a semiconductor device, an electronic control unit, and a control method of a PLL circuit. For example, the present invention relates to a PLL circuit, a semiconductor device, an electronic control unit, and a control method of a PLL circuit which are suitable for adjusting the phase of an output clock signal with a high accuracy.

An automobile is equipped with an angular velocity sensor that detects an angular velocity; an acceleration sensor that detects an acceleration; and an electronic control unit (ECU (Electronic Control Unit)) that performs brake control and engine control to prevent a side slip of the automobile, and controls the operation of an airbag, based on detection results from the angular velocity sensor and the acceleration sensor.

The electronic control unit is provided with a PLL circuit that generates an output clock signal by using a resonance signal from the angular velocity sensor as a reference clock signal. A clock signal orthogonal to the reference clock signal is generated based on the output clock signal. The electronic control unit multiplies a modulated signal (a signal obtained by modulating the resonance signal with a sensitivity signal), which is output from the angular velocity sensor, by the clock signal orthogonal to the reference clock signal, thereby detecting only sensitivity signal components (angular velocity components) from a modulated signal.

In order to accurately detect the sensitivity signal components, the PLL circuit is required to reduce the deviation of the phase of the output clock signal from the phase of the reference clock signal as much as possible. In other words, the PLL circuit is required to accurately adjust the phase of the output clock signal.

Japanese Unexamined Patent Application Publication No. 2013-77966 discloses a technique relating to a PLL circuit. The PLL circuit disclosed in Japanese Unexamined Patent Application Publication No. 2013-77966 includes a pulse signal generation unit, a charge pump, a low-pass filter, and a voltage control oscillation circuit. The pulse signal generation unit generates a pulse signal according to a multi-level reference signal having a periodicity. The charge pump switches ON/OFF of the output current according to the pulse signal. The low-pass filter generates a control voltage according to the output current. The voltage control oscillation circuit generates an output clock signal having a frequency according to the control voltage. The PLL circuit adjusts the amount of current when the output current is turned on according to the reference signal. Thus, the PLL circuit improves the accuracy of the phase adjustment of the output clock signal.

SUMMARY

However, the adjustment of the amount of current of the charge pump in the PLL circuit disclosed in Japanese Unexamined Patent Application Publication No. 2013-77966 is insufficient to improve the accuracy of the phase adjustment of the output clock signal. Other problems to be solved by and novel features of the present invention will become apparent from the following description and the accompanying drawings.

According to one embodiment, a PLL circuit includes: a phase difference detection unit that captures an instantaneous value of a reference clock signal in synchronization with a feedback clock signal, and detects a phase difference between the reference clock signal and the feedback clock signal based on the captured instantaneous value, the reference clock signal being a digital sine wave; a control voltage generation unit that generates a control voltage according to the phase difference; a voltage control oscillator that generates an output clock signal having a frequency according to the control voltage; a frequency divider that divides a frequency of the output clock signal to generate the feedback clock signal; and a control unit that amplifies the reference clock signal to be supplied to the phase difference detection unit with an amplification factor according to the phase difference.

According to another embodiment, a control method of a PLL circuit includes: capturing an instantaneous value of a reference clock signal in synchronization with a feedback clock signal, and detecting a phase difference between the reference clock signal and the feedback clock signal based on the captured instantaneous value, the reference clock signal being a digital sine wave; generating a control voltage according to the phase difference; generating an output clock signal having a frequency according to the control voltage; dividing a frequency of the output clock signal to generate the feedback clock signal; and amplifying the reference clock signal with an amplification factor according to the phase difference.

According to the aspects of the present invention, it is possible to provide a PLL circuit, a semiconductor device, an electronic control unit, and a control method of a PLL circuit which are capable of accurately adjusting the phase of the output clock signal.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
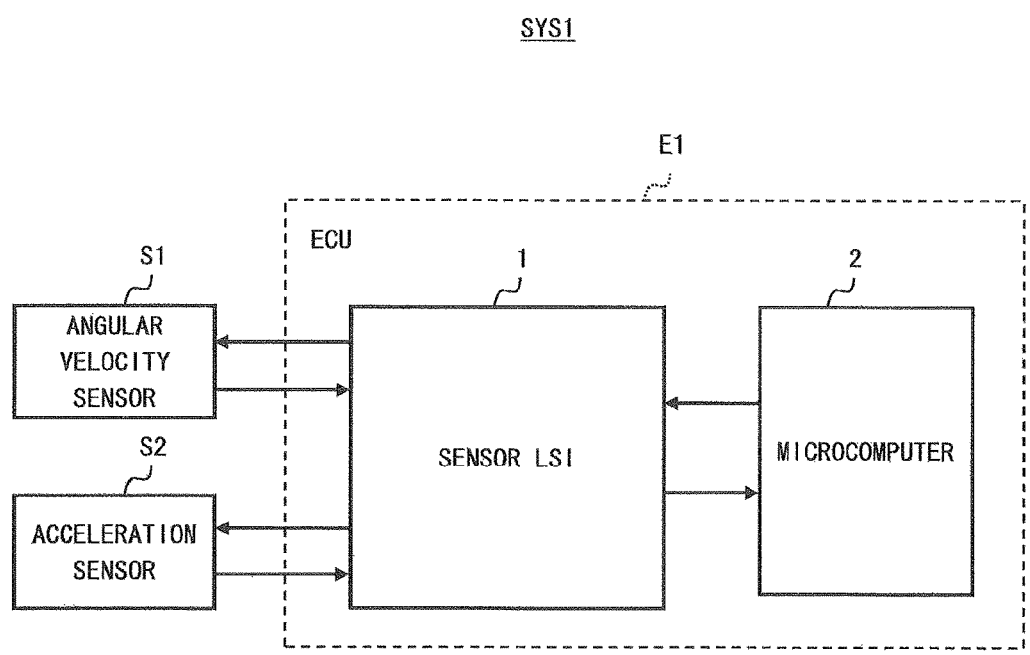
FIG. 1 is a block diagram showing a configuration example of an electronic control system according to a first embodiment.

Hereinafter, embodiments will be described with reference to the accompanying drawings. The drawings are made in a simplified manner, and therefore the technical scope of embodiments of the invention should not be narrowly interpreted based on the drawings. The same elements are denoted by the same reference numerals, and repeated descriptions thereof are omitted.

In the following embodiments, explanations are made by referring to several sections or several embodiments for convenience, as required, but they are mutually related, and are in such a relation to each other that one of them is a modified example, an application example, a detailed explanation, a supplemental explanation, or the like of some or all of the other, unless otherwise specified. Further, in the following embodiment, when the number of elements (including the number of items, numerical value, quantity, range, etc.) or the like is mentioned, the number is not limited to that specific number, and may be larger or smaller than the mentioned number, except for the case where it is explicitly indicated that the number should be the specifically-mentioned number or it is theoretically clear that the number should be limited to the specifically-mentioned number.

Further, in the following embodiments, the constituent elements thereof (including operation steps etc.) are not necessarily indispensable, except for the case where it is explicitly indicated that a specific element is indispensable, or it is theoretically clear that a specific element is indispensable. Similarly, in the following embodiments, when shapes, positional relationships, etc. of the constituent elements are mentioned, they include substantially similar or analogous shapes and so forth, except for the case where it is explicitly indicated or it is theoretically clear that the above is not true. This also applies to the above-mentioned values (including the number of items, numerical value, quantity, range, etc.) and the like.

First Embodiment

FIG. 1 is a block diagram showing a configuration example of an electronic control system SYS1 according to a first embodiment. As shown in FIG. 1, the electronic control system SYS1 is mounted on, for example, an automobile. The electronic control system SYS1 includes an angular velocity sensor S1, an acceleration sensor S2, and an electronic control unit E1. The electronic control unit E1 includes a sensor LSI (semiconductor device) 1 and a microcomputer (arithmetic processing unit; hereinafter referred to simply as a microcomputer) 2.

The angular velocity sensor S1 is a sensor that is composed of a resonant element and detects the angular velocity of the automobile. The acceleration sensor S2 is a sensor that detects the acceleration of the automobile. The electronic control unit E1 is a unit that performs predetermined arithmetic processing based on detection results from the angular velocity sensor S1 and the acceleration sensor S2.

For example, when the electronic control unit E1 determines that the angular velocity (rotational speed) of the automobile is too high, based on the detection result from the angular velocity sensor S2, the electronic control unit E1 automatically performs brake control and engine control to prevent a side slip of the automobile. Further, when the electronic control unit E1 determines that the acceleration of the automobile is rapidly lowered (i.e., when there is a possibility that the automobile has collided with an obstacle) based on the detection result from the acceleration sensor S2, the electronic control unit E1 automatically controls the operation of an airbag.

(Details of the Electronic Control Unit E1)

The electronic control unit E1 will be described in more detail with reference to FIG. 2.

Figure 2:
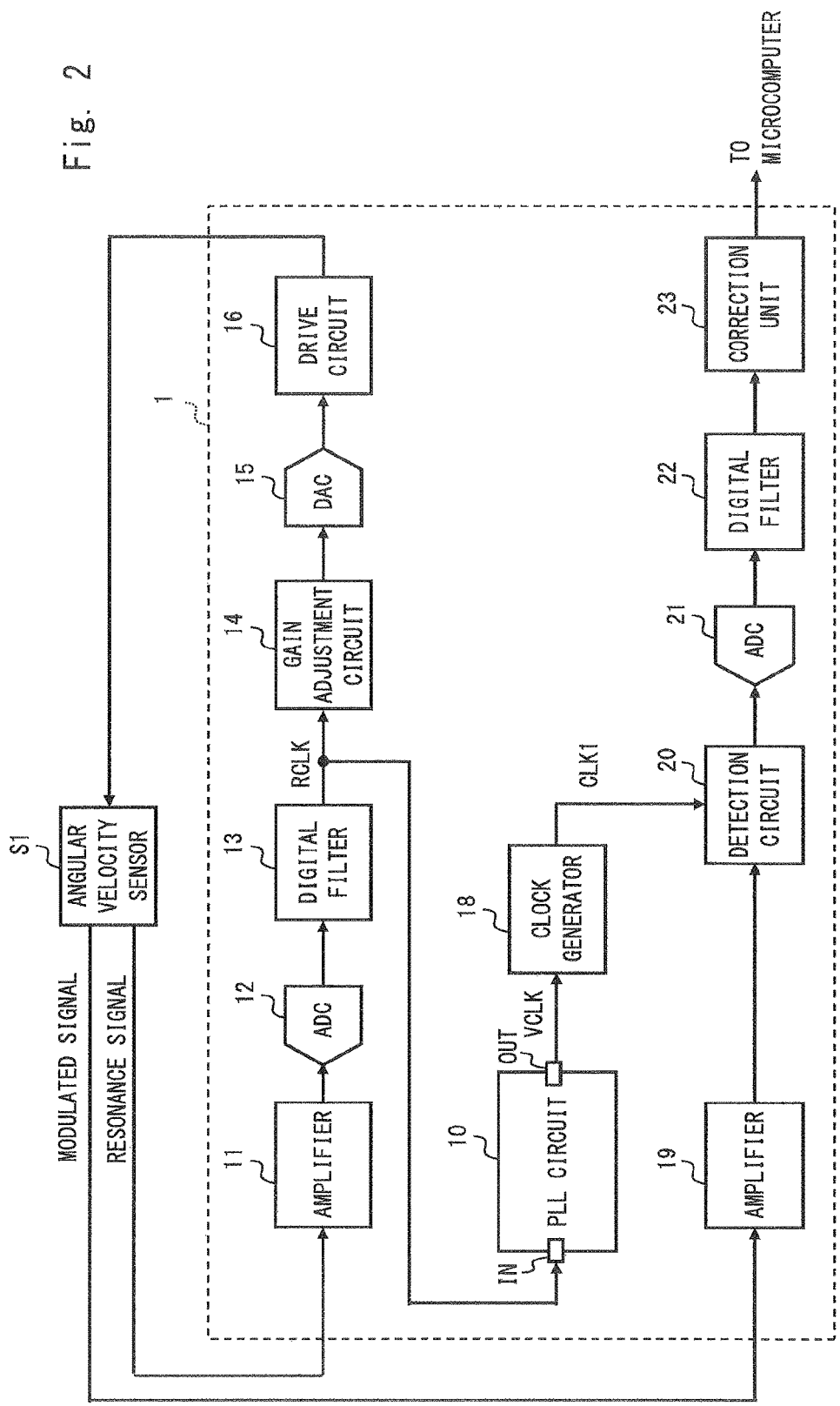
FIG. 2 is a block diagram showing a specific configuration example of angular velocity sensor control of a sensor LSI provided in the electronic control system shown in FIG. 1.

FIG. 2 is a block diagram showing a specific configuration example of angular velocity sensor control of the sensor LSI 1 which is provided in the electronic control unit E1. FIG. 2 also shows the angular velocity sensor S1.

As shown in FIG. 2, the sensor LSI 1 includes a PLL circuit 10, an amplifier 11, an AD converter 12, a digital filter 13, a gain adjustment circuit 14, a DA converter 15, a drive circuit 16, a clock generator 18, an amplifier 19, a detection circuit 20, an AD converter 21, a digital filter 22, and a correction unit 23.

Since the angular velocity sensor S1 is composed of a resonant element, the angular velocity sensor S1 outputs a resonance signal having a predetermined frequency, and when the angular velocity is detected, the angular velocity sensor S1 outputs a signal (modulated signal) obtained by modulating the resonance signal with a sensitivity signal.

In the sensor LSI 1, the amplifier 11 amplifies the resonance signal from the angular velocity sensor S1. The AD converter 12 performs an AD conversion on the resonance signal amplified by the amplifier 11, and outputs the resultant signal. The digital filter 13 eliminates noise components included in the output signal from the AD converter 12. The output of the digital filter 13 is a digital sine wave and is used as a reference clock signal RCLK.

The gain adjustment circuit 14 adjusts the gain of the output signal according to the amplitude of the reference clock signal RCLK. For example, when the amplitude of the reference clock signal RCLK is large, the gain adjustment circuit 14 decreases the gain of the output signal, and when the amplitude of the reference clock signal RCLK is small, the gain adjustment circuit 14 increases the gain of the output signal. As a result, the amplitude value of the output signal from the gain adjustment circuit 14 is stabilized. The DA converter 15 performs a DA conversion on the output signal from the gain adjustment circuit 14, and outputs the resultant signal. The drive circuit 16 drives the angular velocity sensor S1 based on the output signal from the DA converter 15.

A feedback circuit composed of the circuits described above allows the frequency of the reference clock signal RCLK to converge to the resonance frequency of the resonant element constituting the angular velocity sensor S1.

The reference clock signal RCLK is supplied to an input terminal IN of the PLL circuit 10. The PLL circuit 10 generates an output clock signal VCLK by multiplying the reference clock signal RCLK, and outputs the output clock signal VCLK from an output terminal OUT. The details of the PLL circuit 10 will be described later.

The clock generator 18 generates a clock signal CLK1 having a predetermined frequency based on the output clock signal VCLK. In this example, the clock generator 18 generates the clock signal CLK1, which is orthogonal to the reference clock signal RCLK, based on the output clock signal VCLK.

The amplifier 19 amplifies the modulated signal from the angular velocity sensor S1. The detection circuit 20 detects sensitivity signal components (angular velocity components) from the modulated signal by multiplying the modulated signal, which is amplified by the amplifier 19, by the clock signal CLK1, which is orthogonal to the reference clock signal RCLK, and outputs the sensitivity signal components.

The AD converter 21 performs an AD conversion on the sensitivity signal components output from the detection circuit 20, and the digital filter 22 eliminates noise components from the sensitivity signal components. Further, the correction unit 23 performs a temperature correction, a zero-point correction, or the like on the sensitivity signal components, and the resultant components are input to the microcomputer 2. The microcomputer 2 executes predetermined arithmetic processing based on angular velocity information and acceleration information which are obtained by the sensor LSI 1 (the description of a method for detecting the acceleration is omitted).

Specifically, for example, when the microcomputer 2 determines that the angular velocity (rotational speed) of the automobile is too high, based on the detection result from the angular velocity sensor S1, the microcomputer 2 automatically performs brake control and engine control to prevent a side slip of the automobile. Further, when the microcomputer 2 determines that the acceleration of the automobile is rapidly lowered (i.e., when there is a possibility that the automobile has collided with an obstacle) based on the detection result from the acceleration sensor S2, the microcomputer 2 automatically controls the operation of the airbag.

In this case, in order to accurately detect the sensitivity signal components, the PLL circuit 10 is required to reduce the deviation of the phase of the output clock signal VCLK from the phase of the reference clock signal RCLK as much as possible. In other words, the PLL circuit 10 is required to accurately adjust the phase of the output clock signal VCLK. By reducing the deviation of the phase of the output clock signal VCLK from the phase of the reference clock signal RCLK, the accuracy of detecting sensitivity signal components by the detection circuit 20 can be improved. Accordingly, for example, the engine control and the airbag operation control to prevent a side slip of the automobile can be performed with a high accuracy.

(Preliminary Review by the Present Inventor)

Prior to giving the detailed description of the PLL circuit 10 in the electronic control unit E1 mounted on the automobile or the like, a PLL circuit 50 which was preliminarily reviewed by the present inventor will be described with reference to FIGS. 7 and 8.

Figure 7:
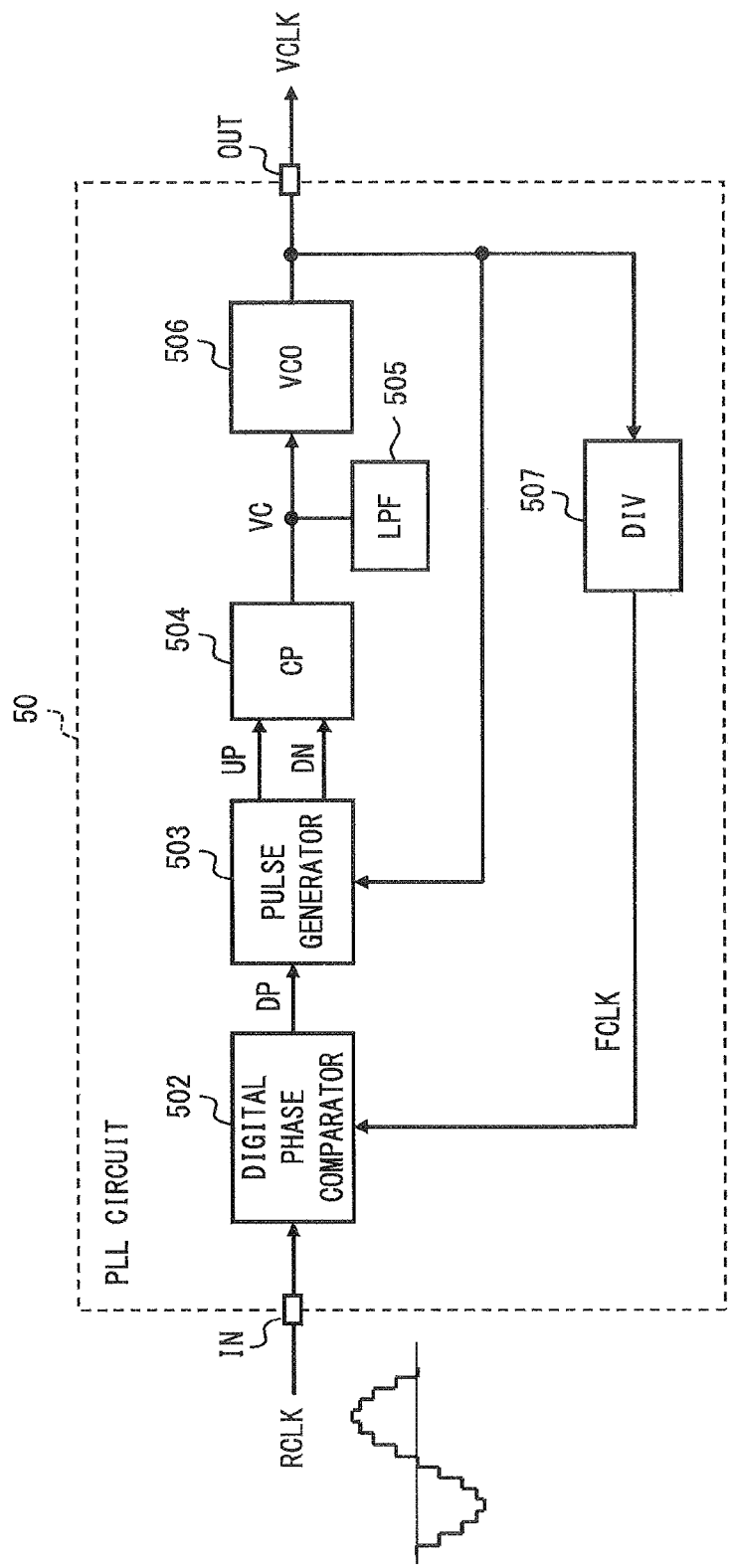
FIG. 7 is a block diagram showing a configuration example of a PLL circuit according to a concept before an embodiment of the invention is conceived.
Figure 8:
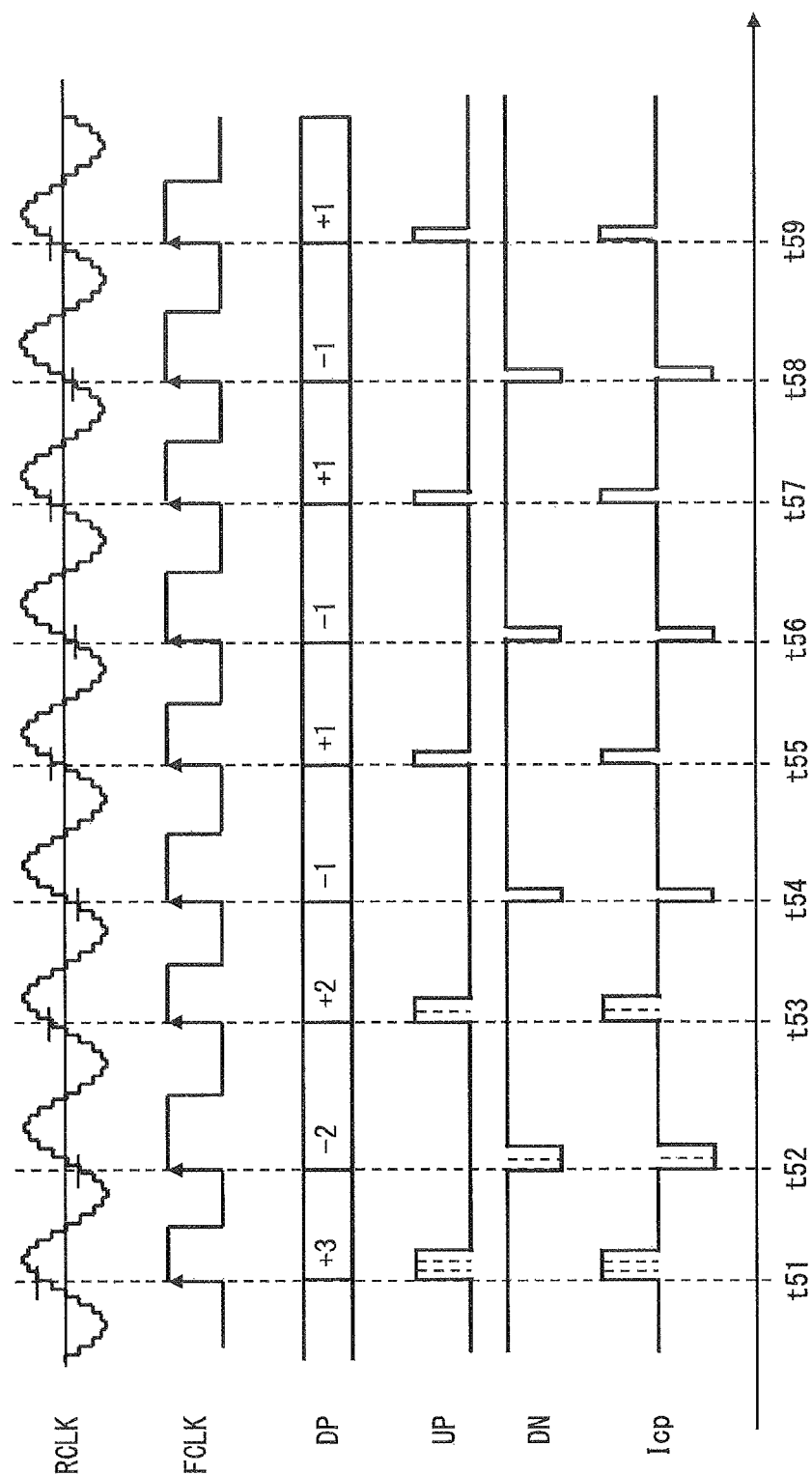
FIG. 8 is a timing diagram showing an operation of the PLL circuit shown in FIG. 7.

FIG. 7 is a block diagram showing a configuration example of the PLL circuit 50 according to a concept before an embodiment of the invention is conceived. FIG. 8 is a timing diagram showing an operation of the PLL circuit 50 according to the concept before an embodiment of the invention is conceived.

The PLL circuit 50 includes a digital phase comparator (phase difference detection unit) 502, a pulse generator 503, a charge pump (CP) 504, a loop filter (LPF) 505, a voltage control oscillator (VCO) 506, and a frequency divider (DIV) 507.

The digital phase comparator 502 compares the phase of the reference clock signal RCLK, which is supplied to the input terminal IN from the outside, with the phase of a feedback clock signal FCLK, and outputs the comparison result as phase difference information DP.

More specifically, the digital phase comparator 502 captures an instantaneous value of the reference clock signal RCLK, which is a digital sine wave, in synchronization with a rising edge of the feedback clock signal FCLK. The digital phase comparator 502 detects the degree of shift (i.e., phase difference) of the phase of the feedback clock signal FCLK from the phase of the reference clock signal RCLK based on the captured instantaneous value of the reference clock signal RCLK. This detection result is output as the phase difference information DP.

When the phase of the feedback clock signal FCLK is delayed from the phase of the reference clock signal RCLK (at times t51, t53, t55, t57, and t59 shown in FIG. 8), the instantaneous value indicates a positive value. Accordingly, the phase difference information DP indicates a positive value. On the other hand, when the phase of the feedback clock signal FCLK is advanced from the phase of the reference clock signal RCLK (at times t52, t54, t56, and t58 shown in FIG. 8), the instantaneous value indicates a negative value. Accordingly, the phase difference information DP indicates a negative value.

The pulse generator 503 outputs pulse signals UP and DN each having a pulse width corresponding to the phase difference information DP. For example, when the captured instantaneous value of the reference clock signal RCLK indicates a positive value, the pulse generator 503 outputs the pulse signal UP having a pulse width proportional to the phase difference information DP (at times t51, t53, t55, t57, and t59 in FIG. 8). When the captured instantaneous value of the reference clock signal RCLK indicates a negative value, the pulse generator 503 outputs the pulse signal DN having a pulse width proportional to the phase difference information DP (at times t52, t54, t56, and t58 in FIG. 8).

The pulse generator 503 controls the rising and falling edges of the pulse signals UP and DN in synchronization with the rising and falling edges of the output clock signal VCLK. Therefore, the pulse width of each of the pulse signals UP and DN is controlled in each half period of the output clock signal VCLK.

The charge pump 504 generates a current Icp for a period of time corresponding to the pulse width of each of the pulse signals UP and DN.

More specifically, the current Icp is caused to flow from the charge pump 504 to the loop filter 505 for a period of time corresponding to the pulse width of the pulse signal UP, thereby accumulating charge in the loop filter 505. Further, the current Icp is caused to flow from the loop filter 505 to the charge pump 504 for a period of time corresponding to the pulse width of the pulse signal DN, thereby extracting the charge accumulated in the loop filter 505.

The loop filter 505 generates a control voltage VC by eliminating high-frequency components of voltage generated based on the current Icp generated by the charge pump 504.

The voltage control oscillator 506 generates the output clock signal VCLK having a frequency according to the control voltage VC. For example, the voltage control oscillator 506 generates the output clock signal VCLK having a frequency that increases as the control voltage VC increases, and the voltage control oscillator 506 also generates the output clock signal VCLK having a frequency that decreases as the control voltage VC decreases. The output clock signal VCLK is output to the outside through the output terminal OUT.

The frequency divider 507 divides the frequency of the output clock signal VCLK, and outputs the feedback clock signal FCLK.

In the PLL circuit 50, when the phase of the feedback clock signal FCLK is delayed from the phase of the reference clock signal RCLK, the pulse signal UP having a pulse width proportional to the phase difference information DP is generated. Accordingly, since the control voltage VC increases, the frequency of the output clock signal VCLK increases. On the other hand, when the phase of the feedback clock signal FCLK is advanced from the phase of the reference clock signal RCLK, the pulse signal DN having a pulse width proportional to the phase difference information DP is generated. Accordingly, since the control voltage VC decreases, the frequency of the output clock signal VCLK decreases. By repeating these operations, the phase difference between the reference clock signal RCLK and the feedback clock signal FCLK approaches zero.

For example, when the frequency of the reference clock signal RCLK is 40 KHz (a period of 25 us) and the frequency division ratio of the frequency divider 507 is 2048, the frequency of the output clock signal VCLK is 81.92 MHz (a period of 12.2 ns). As described above, the pulse width of each of the pulse signals UP and DN is controlled in each half period (6.1 ns) of the output clock signal VCLK. Therefore, the phase of the feedback clock signal FCLK can be adjusted with a resolution of 0.088 deg (=360 deg×6.1 ns/25 us).

However, the configuration of the PLL circuit 50 also has a problem that the accuracy of the phase adjustment of the output clock signal VCLK is still low. When the accuracy of the phase adjustment of the output clock signal VCLK is low, the deviation of the phase of the output clock signal VCLK from the phase of the reference clock signal RCLK increases, which leads to deterioration in the accuracy of detecting sensitivity signal components by the detection circuit 20 in the sensor LSI 1. As a result, for example, the engine control and the air bag operation control to prevent a side slip of the automobile cannot be performed with a high accuracy.

The accuracy of the phase adjustment of the output clock signal VCLK can be improved by increasing the frequency of the output clock signal VCLK and reducing the units of adjustment for the pulse width of each of the pulse signals UP and DN. However, in this case, the power consumption increases and jitter noise occurs due to high multiplication. Further, the accuracy of the phase adjustment of the output clock signal VCLK can be improved by using the digital phase comparator 502 having a high operation accuracy. However, in this case, the circuit size increases and the power consumption increases.

Thus, the PLL circuit 10 according to the first embodiment has been made so that the phase of the output clock signal VCLK can be accurately adjusted without increasing the frequency of the output clock signal VCLK and without the need for using the digital phase comparator having a high operation accuracy.

(PLL Circuit 10 According to the First Embodiment)

Figure 3:
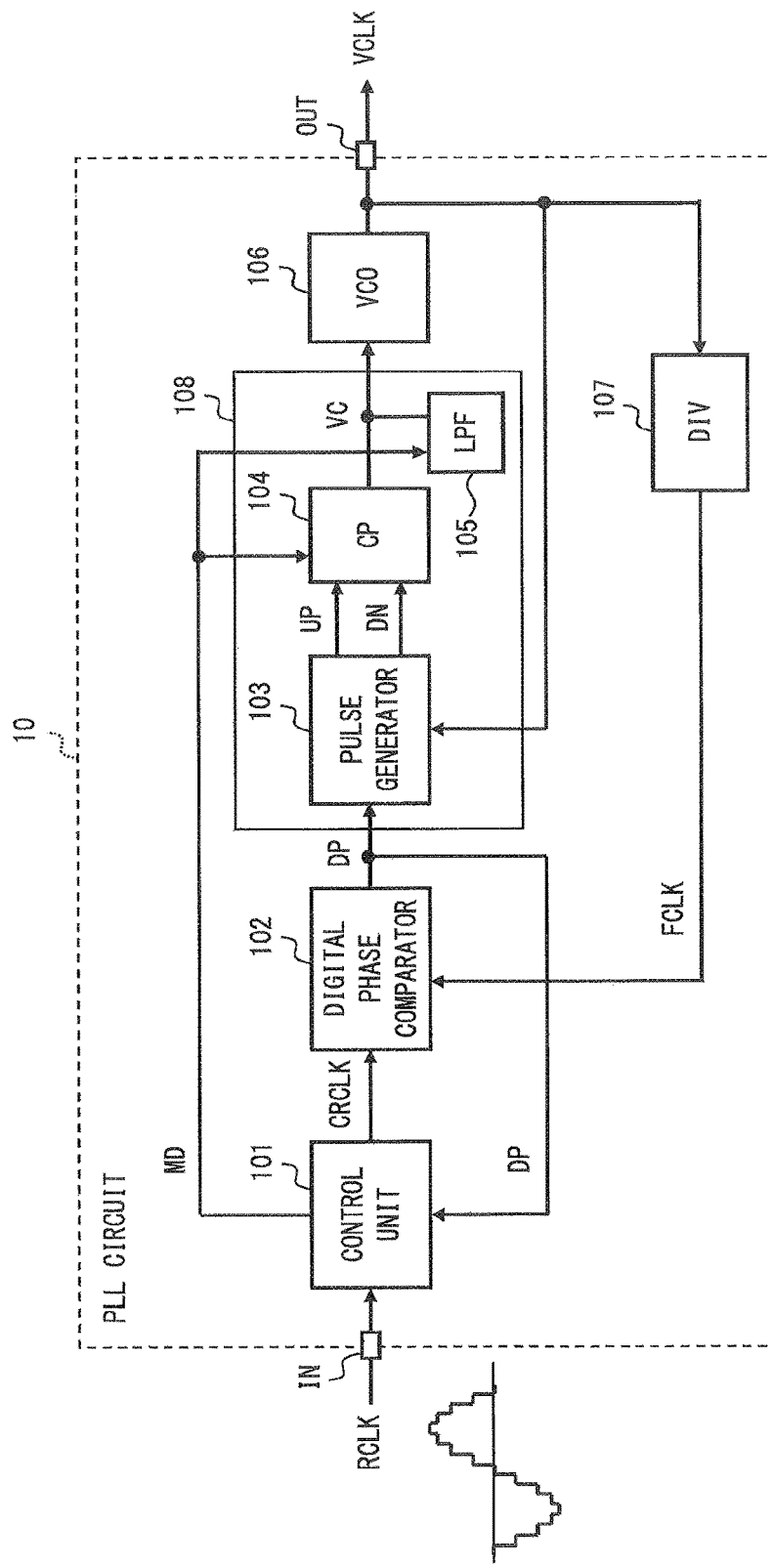
FIG. 3 is a block diagram showing a configuration example of a PLL circuit provided in the sensor LIS shown in FIG. 2.
Figure 4:
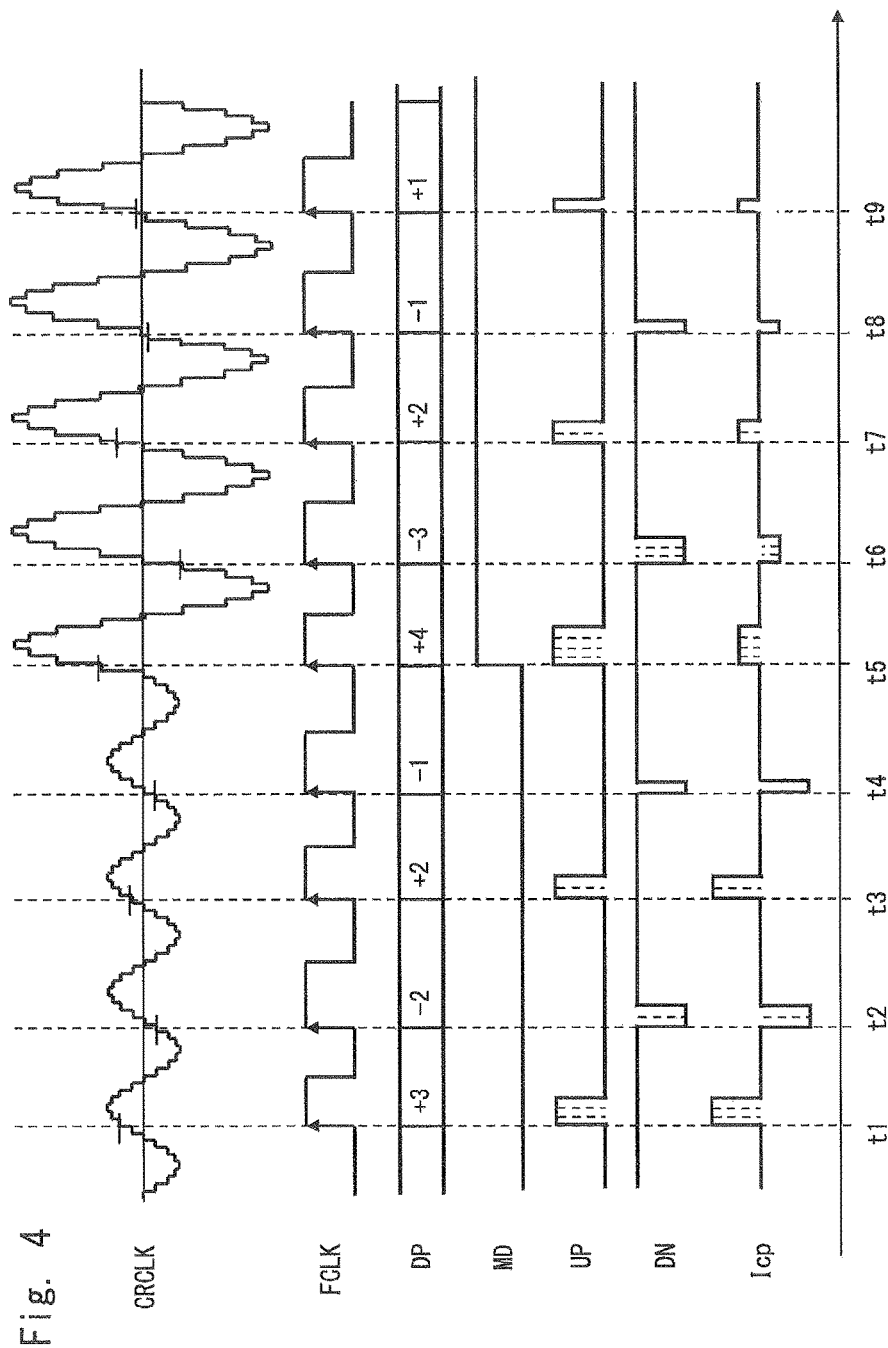
FIG. 4 is a timing diagram showing an operation of the PLL circuit shown in FIG. 3.

FIG. 3 is a block diagram showing a configuration example of the PLL circuit 10. FIG. 4 is a timing diagram showing an operation of the PLL circuit 10.

The PLL circuit 10 includes a control unit 101, a digital phase comparator (phase difference detection unit) 102, a pulse generator (pulse signal generation unit) 103, a charge pump (CP) 104, a loop filter (LPF) 105, a voltage control oscillator (VCO) 106, and a frequency divider (DIV) 107. The pulse generator 103, the charge pump 104, and the loop filter 105 constitute a control voltage generation unit 108.

The control unit 101 amplifies the reference clock signal RCLK, which is a digital sine wave supplied to the input terminal IN from the outside, with an amplification factor according to the phase difference information DP, and outputs a reference clock signal CRCLK. For example, when the phase difference information DP indicates a value equal to or smaller than a predetermined value, the control unit 101 amplifies the reference clock signal RCLK with an amplification factor larger than that when the phase difference information DP indicates a value exceeding the predetermined value. The amplification of the reference clock signal RCLK described herein indicates that the digital value of the reference clock signal RCLK is converted so as to amplify the amplitude of the digital sine wave of the reference clock signal RCLK.

The first embodiment illustrates a case where the control unit 101 can change the amplification factor to 1 or 4. For example, in an initial state, the amplification factor is set to 1. In other words, in the initial state, the control unit 101 directly outputs the reference clock signal RCLK as the reference clock signal CRCLK. The details of the control unit 101 will be described later.

The digital phase comparator 102 compares the phase of the reference clock signal CRCLK with the phase of the feedback clock signal FCLK, and outputs the comparison result as the phase difference information DP.

More specifically, the digital phase comparator 102 captures an instantaneous value of the reference clock signal CRCLK, which is a digital sine wave, in synchronization with a rising edge of the feedback clock signal FCLK. Further, the digital phase comparator 102 detects the degree of shift (i.e., phase difference) of the phase of the feedback clock signal FCLK from the phase of the reference clock CRCLK based on the captured instantaneous value of the reference clock signal CRCLK. This detection result is output as the phase difference information DP.

When the phase of the feedback clock signal FCLK is delayed from the phase of the reference clock signal CRCLK (at times t1, t3, t5, t7, and t9 shown in FIG. 4), the instantaneous value indicates a positive value. Accordingly, the phase difference information DP indicates a positive value. On the other hand, when the phase of the feedback clock signal FCLK is advanced from the phase of the reference clock signal CRCLK (at times t2, t4, t6, and t8 shown in FIG. 4), the instantaneous value indicates a negative value. Accordingly, the phase difference information DP indicates a negative value.

The pulse generator 103 outputs the pulse signals UP and DN each having a pulse width corresponding to the phase difference information DP. For example, when the captured instantaneous value of the reference clock signal CRCLK indicates a positive value, the pulse generator 103 outputs the pulse signal UP having a pulse width proportional to the phase difference information DP (at times t1, t3, t5, t7, and t9 shown in FIG. 4). When the captured instantaneous value of the reference clock signal CRCLK indicates a negative value, the pulse generator 103 outputs the pulse signal DN having a pulse width proportional to the phase difference information DP (at times t2, t4, t6, and t8 shown in FIG. 4).

The pulse generator 103 controls the rising and falling edges of the pulse signals UP and DN in synchronization with the rising and falling edges of the output clock signal VCLK. Thus, the pulse width of each of the pulse signals UP and DN is controlled in each half period of the output clock signal VCLK.

Accordingly, for example, when the phase difference information DP indicates "+3" (at time t1 shown in FIG. 4), the pulse generator 103 outputs the pulse signal UP having a pulse width that is three times the half period of the output clock signal VCLK. When the phase difference information DP indicates "−2" (at time t2 shown in FIG. 4), the pulse generator 103 outputs the pulse signal DN having a pulse width that is twice the half period of the output clock signal VCLK.

The charge pump 104 outputs the current Icp for a period of time corresponding to the pulse width of each of the pulse signals UP and DN.

More specifically, the current Icp is caused to flow from the charge pump 104 to the loop filter 105 for a period of time corresponding to the pulse width of the pulse signal UP, thereby accumulating charge in the loop filter 105. Further, the current Icp is caused to flow from the loop filter 105 to the charge pump 104 for a period of time corresponding to the pulse width of the pulse signal DN, thereby extracting the charge accumulated in the loop filter 105.

The loop filter 105 generates the control voltage VC by eliminating high-frequency components of voltage generated based on the current Icp generated by the charge pump 104.

The voltage control oscillator 106 generates the output clock signal VCLK having a frequency according to the control voltage VC. For example, the voltage control oscillator 106 generates the output clock signal VCLK having a frequency that increases as the control voltage VC increases, and the voltage control oscillator 106 also generates the output clock signal VCLK having a frequency that decreases as the control voltage VC decreases. The output clock signal VCLK is output to the outside through the output terminal OUT.

The frequency divider 107 divides the frequency of the output clock signal VCLK, and outputs the feedback clock signal FCLK. Depending on the required specifications, instead of the output clock signal VCLK, the feedback clock signal FCLK may be output to the outside through the output terminal OUT.

In the PLL circuit 10, when the phase of the feedback clock signal FCLK is delayed from the phase of the reference clock signal CRCLK, the pulse signal UP having a pulse width proportional to the phase difference information DP is generated. Accordingly, since the control voltage VC increases, the frequency of the output clock signal VCLK increases. On the other hand, when the phase of the feedback clock signal FCLK is advanced from the phase of the reference clock signal CRCLK, the pulse signal DN having a pulse width proportional to the phase difference information DP is generated. Accordingly, since the control voltage VC decreases, the frequency of the output clock signal VCLK decreases. By repeating these operations, the phase difference between the reference clock signal CRCLK and the feedback clock signal FCLK approaches zero.

For example, when the frequency of each of the reference clock signals RCLK and CRCLK is 40 KHz (a period of 25 us) and the frequency division ratio of the frequency divider 107 is 2048, the frequency of the output clock signal VCLK is 81.92 MHz (a period of 12.2 ns). In this case, as described above, the pulse width of each of the pulse signals UP and DN is controlled in each half period (6.1 ns) of the output clock signal VCLK. Therefore, the phase of the feedback clock signal FCLK can be adjusted with a resolution of 0.088 deg (=360 deg×6.1 ns/25 us) with respect to the phase of the reference clock signal CRCLK. In other words, the phase difference between the reference clock signal CRCLK and the feedback clock signal FCLK can be adjusted with a resolution of 0.088 deg.

In this case, when the amplification factor is 1 and the phase difference information indicates a value equal to or smaller than the predetermined value, the control unit 101 changes the amplification factor from 1 to 4. Accordingly, the amplitude of the reference clock signal CRCLK after the amplification is four times the amplitude of the reference clock signal RCLK before the amplification. In other words, the input sensitivity of the reference clock signal CRCLK in the digital phase comparator 102 is four times the input sensitivity obtained when the reference clock signal RCLK is input. As a result, the phase difference between the reference clock signal RCLK before the amplification and the feedback clock signal FCLK can be adjusted with a high resolution of 0.022 deg (=0.088 deg/4). In other words, the accuracy of the phase adjustment of the output clock signal VCLK is quadrupled.

In the case where the control unit 101 changes the amplification factor from 1 to 4 when the phase difference information DP indicates a value equal to or smaller than the predetermined value, the control unit 101 outputs change information MD to the charge pump 104 and the loop filter 105. With this configuration, the current Icp generated by the charge pump 104 is limited. Further, the characteristics of the loop filter 105 are changed so that noise components that vary in accordance with the limitation of the current Icp are eliminated. For example, when the control unit 101 changes the amplification factor from 1 to 4, the control unit 101 limits the value of the current Icp to ¼. Accordingly, even when the pulse width of each of the pulse signals UP and DN is quadrupled, the pulse height (i.e., the amount of current) is reduced to ¼. Therefore, an increase in the amount of charge accumulated in the loop filter 105 and an increase in the amount of charge extracted from the loop filter 105 can be suppressed. Consequently, an increase in variation of the control voltage VC is suppressed, so that the output clock signal VCLK can be stabilized.

In the example shown in FIG. 4, the amplification factor is set to 1 in the period from time t1 to time t5. Accordingly, the input sensitivity of the reference clock signal CRCLK in the digital phase comparator 102 is the same as the input sensitivity obtained when the reference clock signal RCLK is input. Therefore, the phase difference between the reference clock signal RCLK before the amplification and the feedback clock signal FCLK is adjusted with a resolution of 0.088 deg.

After that, when the phase difference information DP indicates a value equal to or smaller than the predetermined value, the amplification factor is changed from 1 to 4. In the example shown in FIG. 4, when the absolute value of the phase difference information DP is equal to or smaller than 1, the amplification factor is changed from 1 to 4 (at time t5). At this time, the value of the current Icp is limited to ¼.

After that, in the period from time t5 to time t9, the amplification factor is set to 4. Accordingly, the amplitude of the reference clock signal CRCLK after the amplification is four times the amplitude of the reference clock signal RCLK before the amplification. Thus, the input sensitivity of the reference clock signal CRCLK in the digital phase comparator 102 is four times the input sensitivity obtained when the reference clock signal RCLK is input. Therefore, the phase difference between the reference clock signal RCLK before the amplification and the feedback clock signal FCLK can be adjusted with a high resolution of 0.022 deg (=0.088 deg/4). Further, since the value of the current Icp is limited to ¼, an increase in variation of the control voltage VC is suppressed. Consequently, the output clock signal VCLK can be stabilized.

After that, when the phase difference information DP indicates a value equal to or greater than the predetermined value (for example, when the absolute value of the phase difference information DP is 4), the amplification factor is changed from 4 to 1 again. Thus, the phase adjustment resolution decreases, and the phase adjustment range increases.

In this manner, when the phase difference between the reference clock signal RCLK and the feedback clock signal FCLK is equal to or smaller than the predetermined value, the PLL circuit 10 increases the input sensitivity of the digital phase comparator 102 by amplifying the reference clock signal RCLK with a high amplification factor. Accordingly, the PLL circuit 10 can adjust the phase difference between the reference clock signal RCLK and the feedback clock signal FCLK with a high resolution. In other words, the PLL circuit 10 can accurately adjust the phase of the output clock signal VCLK without increasing the frequency of the output clock signal VCLK and without the need for using the digital phase comparator 102 having a high operation accuracy.

In the case where the PLL circuit 10 increases the amplification factor when the phase difference between the reference clock signal RCLK and the feedback clock signal FCLK is equal to or smaller than the predetermined value, the PLL circuit 10 limits the current Icp generated by the charge pump 104. Consequently, the PLL circuit 10 can suppress an increase in variation of the control voltage VC, so that the output clock signal VCLK can be stabilized.

The first embodiment illustrates an example in which the control unit 101 controls the current Icp of the charge pump 104, as well as the amplification factor of the reference clock signal RCLK, but the present invention is not limited to this example. It is sufficient that the control unit 101 can control at least the amplification factor of the reference clock signal RCLK.

Further, the first embodiment illustrates an example in which the control unit 101 can change the amplification factor to 1 or 4, but the present invention is not limited to this example. The amplification factor can be changed to any other value. When the amplification factor is changed to N (N is an arbitrary value), it is preferable to control the value of the current Icp to be 1/N.

Furthermore, the first embodiment illustrates an example in which the amplification factor is changed from 1 to 4 when the absolute value of the phase difference information DP is equal to or smaller than 1, and the amplification factor is changed from 4 to 1 when the absolute value of the phase difference information DP is greater than 4. However, the present invention is not limited to this example. The threshold of the phase difference information DP, which is a criteria for determining whether or not to change the amplification factor, can be arbitrarily set.

(Specific Method for Amplifying the Reference Clock Signal RCLK)

Figure 5:
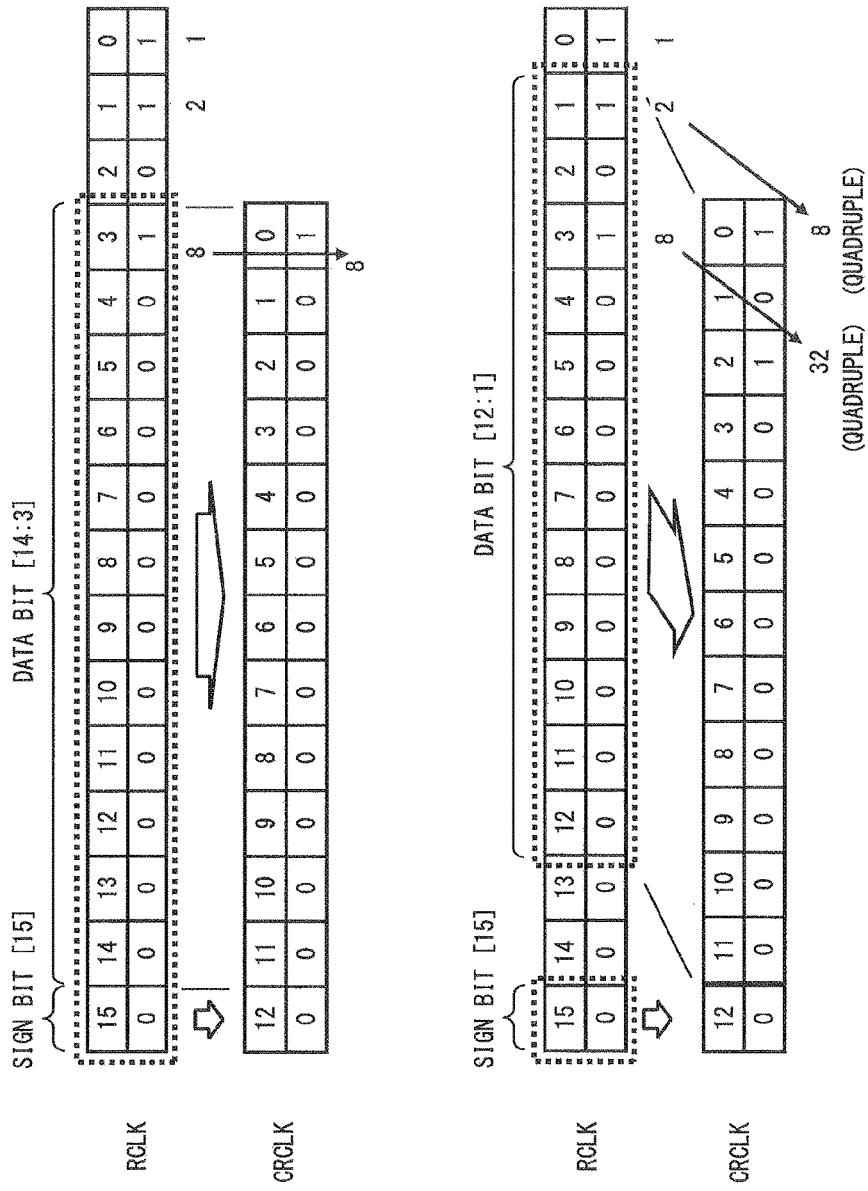
FIG. 5 is a diagram for explaining an example of a specific amplification method for a reference clock signal.

Next, an example of a specific method for amplifying the reference clock signal RCLK by the control unit 101 will be described with reference to FIG. 5. FIG. 5 is a diagram for explaining an example of a specific method for amplifying the reference clock signal RCLK.

As shown in FIG. 5, the reference clock signal RCLK is composed of, for example, 16-bit digital values representing a sine wave. The 15th bit is a sign bit and the 14th to 0th bits are data bits.

In the example shown in FIG. 5, the digital value of the 15th bit represents "0" and the digital values of the 14th to 0th bits represent "000000000001011". That is, the value of the reference clock signal RCLK represents +11 in decimal notation.

In this case, the phase adjustment accuracy is limited to the adjustment accuracy of the pulse width of the pulse signals UP and DN. For this reason, the reference clock signal CRCLK input to the digital phase comparator 102 does not require 16-bit accuracy. For example, about 13-bit accuracy is sufficient. As a matter of course, the bit accuracy required for the reference clock signal CRCLK varies depending on the adjustment accuracy of the pulse width of the pulse signals UP and DN.

When the amplification factor is 1, the sign bit of the 15th bit in the 16 bits of the reference clock signal RCLK and the upper 12 bits (14th to 3rd bits) in the bits of the 15-bit data are used to compare the phase of the reference clock signal CRCLK with the phase of the feedback clock signal FCLK. Specifically, when the amplification factor is 1, the bits [15] and [14:3] of the reference clock signal RCLK are used as the bits [12:0] of the reference clock signal CRCLK after the amplification. At this time, since the lower three bits of the reference clock signal RCLK are not used, the value of the reference clock signal CRCLK after the amplification represents +8 in decimal notation.

Next, when the amplification factor is 4, the sign bit of the 15th bit in the 16 bits of the reference clock signal RCLK and the 12th to 1st bits in the bits of the 15-bit data are used to compare the phase of the reference clock signal CRCLK with the phase of the feedback clock signal FCLK. Specifically, when the amplification factor is 4, the bits [15] and [12:1] of the reference clock signal RCLK are used as the bits [12:0] of the reference clock signal CRCLK after the amplification. Accordingly, the digital sign wave of the reference clock signal RCLK is amplified four times and used as the reference clock signal CRCLK. At this time, since the 3rd and 2nd bits of the reference clock signal RCLK are newly used, the value of the reference clock signal CRCLK after the amplification represents +40 (=+8× 4+2×4) in decimal notation.

Thus, when the amplification factor is changed from 1 to 4, it is only necessary that the data bits used as the bits [11:0] of the reference clock signal CRCLK after the amplification be changed from the bits [14:3] to the bits [12:1] of the reference clock signal RCLK.

When the amplification factor is changed from 1 to 8, the data bits used as the bits [11:0] of the reference clock signal CRCLK after the amplification may be changed from the bits [14:3] to the bits [11:0] of the reference clock signal RCLK. That is, in the case of the amplification method shown in FIG. 5, the value N of the amplification factor is represented by $2^M$ (M is an integer equal to or greater than 1).

Second Embodiment

In the first embodiment, the control unit 101 can change the amplification factor to 1 or 4, whereas in a second embodiment, the control unit 101 can change the amplification factor to three or more values.

A case where the control unit 101 can change the amplification factor to 1, 16, or 512 will be described below.

For example, when the amplification factor is 1, the sign bit of the 15th bit in the 16 bits of the reference clock signal RCLK and the 14th to 9th bits in the bits of the 15-bit data are used to compare the phase of the reference clock signal CRCLK with the phase of the feedback clock signal FCLK. Specifically, when the amplification factor is 1, the bits [15] and [14:9] of the reference clock signal RCLK are used as the bits [6:0] of the reference clock signal CRCLK after the amplification. In this case, the phase adjustment accuracy decreases, and the phase adjustment range increases.

Next, when the amplification factor is 16, the sign bit of the 15th bit in the 16 bits of the reference clock signal RCLK and the 10th to 5th bits in the bits of the 15-bit data are used to compare the phase of the reference clock signal CRCLK with the phase of the feedback clock signal FCLK. Specifically, when the amplification factor is 16, the bits [15] and [10:5] of the reference clock signal RCLK are used as the bits [6:0] of the reference clock CRCLK after the amplification. In this case, the phase adjustment accuracy is medium, and the phase adjustment range is also medium.

Next, when the amplification factor is 512, the sign bit of the 15th bit in the 16 bits of the reference clock signal RCLK and the 6th to 1st bits in the bits of the 15-bit data are used to compare the phase of the reference clock signal CRCLK with the phase of the feedback clock signal FCLK. Specifically, when the amplification factor is 512, the bits [15] and [6:1] of the reference clock signal RCLK are used as the bits [6:0] of the reference clock signal CRCLK after the amplification. In this case, the phase adjustment accuracy increases, and the phase adjustment range decreases.

In this manner, when the amplification factor is changed stepwise from 1 to 16 and from 16 to 512, it is only necessary that the data bits used as the bits [5:0] of the reference clock signal CRCLK after the amplification be changed from the bits [14:9] to the bits [10:5] of the reference clock signal RCLK and then changed from the bits [10:5] to the bits [6:1] of the reference clock signal RCLK. With this configuration, the number of bits used for operations in the digital phase comparator 102 is reduced, so that an increase in circuit size and an increase in power consumption can be suppressed.

The second embodiment illustrates an example in which the control unit 101 can change the amplification factor to 1, 16, or 512, but the present invention is not limited to this example. The amplification factor can be changed to any other value.

Further, the second embodiment illustrates an example in which the control unit 101 can change the amplification factor to three values, but the present invention is not limited to this example. The configuration of the control unit 101 can be changed to any configuration in which the amplification factor can be changed to three or more values.

Third Embodiment

Figure 6:
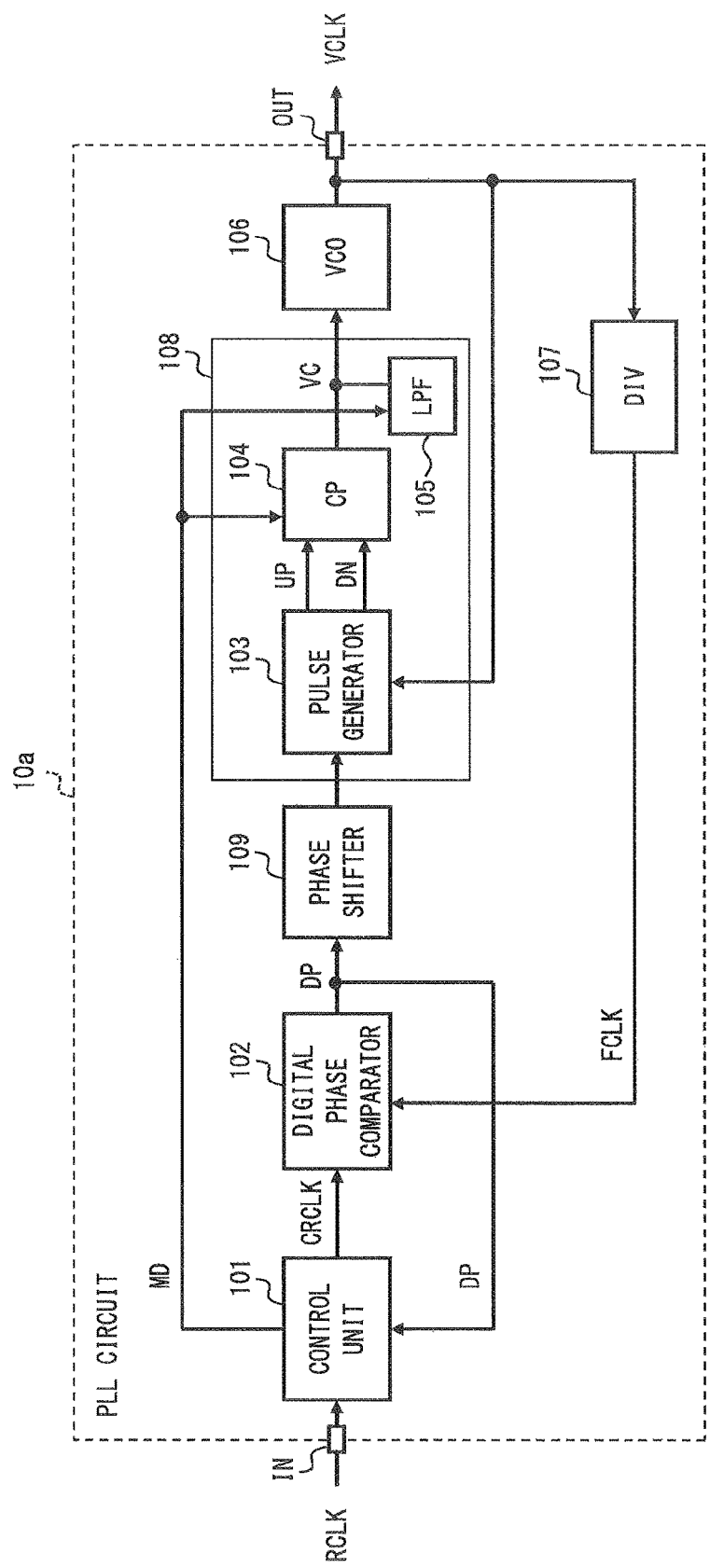
FIG. 6 is a block diagram showing a configuration example of a PLL circuit according to a third embodiment.

FIG. 6 is a block diagram showing a configuration of a PLL circuit 10a according to a third embodiment. The PLL circuit 10a differs from the PLL circuit 10 in that the PLL circuit 10a further includes a phase shifter 109. The other components of the PLL circuit 10a are similar to those of the PLL circuit 10, and thus the descriptions thereof are omitted.

The phase shifter 109 is disposed between the digital phase comparator 102 and the pulse generator 103, and adds a constant P to the phase difference information DP from the digital phase comparator 102, or subtracts the constant P from the phase difference information DP.

With this configuration, the PLL circuit 10a allows the phase of the feedback clock signal FCLK to converge to a phase that is advanced or delayed by an amount corresponding to the constant P (for example, phase adjustment resolution×constant P) with respect to the phase of the reference clock signal CRCLK. This indicates that the phase of the feedback clock signal RCLK can be arbitrarily adjusted with a phase adjustment resolution based on the phase of the reference clock signal CRCLK. As the value of the amplification factor is increased, the resolution of the phase shift of the phase shifter 109 is also increased.

The third embodiment illustrates an example in which the control unit 101 controls the current Icp of the charge pump 104, as well as the amplification factor of the reference clock signal RCLK. However, the present invention is not limited to this example. It is sufficient that the control unit 101 can control at least the amplification factor of the reference clock signal RCLK.

As described above, when the phase difference between the reference clock signal RCLK and the feedback clock signal FCLK is equal to or smaller than the predetermined value, the PLL circuit 10 according to the first and second embodiments and the PLL circuit 10a according to the third embodiment increase the input sensitivity of the digital phase comparator 102 by amplifying the reference clock signal RCLK with a high amplification factor. Therefore, the PLL circuit 10 according to the first and second embodiments and the PLL circuit 10a according to the third embodiment can adjust the phase difference between the reference clock signal RCLK and the feedback clock signal FCLK with a high resolution. In other words, the PLL circuit 10 according to the first and second embodiments and the PLL circuit 10a according to the third embodiment can accurately adjust the phase of the output clock signal VCLK without increasing the frequency of the output clock signal VCLK and without the need for using the digital phase comparator 102 having a high operation accuracy.

Further, in the case where the magnification factor is increased when the phase difference between the reference clock signal RCLK and the feedback clock signal FCLK is equal to or smaller than the predetermined value, the PLL circuit 10 according to the first and second embodiments and the PLL circuit 10a according to the third embodiment limit the value of the current Icp generated by the charge pump 104. With this configuration, the PLL circuit 10 according to the first and second embodiments and the PLL circuit 10a according to the third embodiment can suppress an increase in variation of the control voltage VC, so that the output clock signal VCLK can be stabilized.

The invention made by the present inventor has been described in detail above. However, the present invention is not limited to the embodiments described above and can be modified in various ways without departing from the scope of the invention.

For example, in the semiconductor devices according to the embodiments described above, the conductivity type (p-type or n-type) of a semiconductor substrate, a semiconductor layer, a diffusion layer (diffusion region), and the like may be reversed. Accordingly, when one of the conductivity types of the n-type and the p-type is defined as a first conductivity type and the other conductivity type is defined as a second conductivity type, the first conductivity type may be the p-type and the second conductivity type may be the n-type. On the contrary, the first conductivity type may be the n-type and the second conductivity type may be the p-type.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A PLL circuit comprising:
a phase difference detection unit that captures an instantaneous value of a reference clock signal in synchronization with a feedback clock signal, and detects a phase difference between the reference clock signal and the feedback clock signal based on the captured instantaneous value, the reference clock signal being a digital sine wave;
a control voltage generation unit that generates a control voltage according to the phase difference;
a voltage control oscillator that generates an output clock signal having a frequency according to the control voltage;
a frequency divider that divides a frequency of the output clock signal to generate the feedback clock signal; and
a control unit that amplifies the reference clock signal to be supplied to the phase difference detection unit with an amplification factor according to the phase difference.

2. The PLL circuit according to claim 1, wherein when the phase difference is larger than a first predetermined value, the control unit amplifies the reference clock signal with an amplification factor larger than that when the phase difference is larger than the first predetermined value.

3. The PLL circuit according to claim 2, wherein when the phase difference is equal to or smaller than a second predetermined value, the control unit amplifies the reference clock signal with an amplification factor larger than that when the phase difference is larger than the second predetermined value and equal to or smaller than the first predetermined value, the second predetermined value being smaller than the first predetermined value.

4. The PLL circuit according to claim 1, wherein
the control voltage generation unit comprises:
  a pulse signal generation unit that generates a pulse signal having a pulse width corresponding to the phase difference;
  a charge pump that outputs a predetermined current for a period of time corresponding to the pulse width of the pulse signal; and
  a loop filter that generates the control voltage according to the predetermined current, and
the control unit controls the predetermined current output from the charge pump according to an amplification factor of the reference clock signal.

5. The PLL circuit according to claim 4, wherein when the phase difference is equal to or smaller than the first predetermined value, the control unit amplifies the reference clock signal with an amplification factor larger than that when the phase difference is larger than the first predetermined value, and decreases the predetermined current output from the charge pump.

6. The PLL circuit according to claim 5, wherein when the phase difference is equal to or smaller than the first predetermined value, the control unit amplifies the reference clock signal with an amplification factor which is N (N is an arbitrary value) times larger than that when the phase difference is larger than the first predetermined value, and multiplies the predetermined current output from the charge pump by 1/N.

7. The PLL circuit according to claim 5, wherein when the phase difference is equal to or smaller than a second predetermined value, the control unit amplifies the reference clock signal with an amplification factor larger than that when the phase difference is larger than the second predetermined value and equal to or smaller than the first predetermined value, and decreases the predetermined current output from the charge pump, the second predetermined value being smaller than the first predetermined value.

8. The PLL circuit according to claim 4, wherein the pulse signal generation unit comprises a pulse signal generator.

9. A semiconductor device comprising:
a DA converter that performs a DA conversion on the reference clock signal;
a drive circuit that drives a resonant element based on an output signal from the DA converter;
an AD converter that performs an AD conversion on the resonance signal generated by the resonant element, and outputs the reference clock signal; and
the PLL circuit according to claim 1 that is supplied with the reference clock signal output from the AD converter.

10. An electronic control unit comprising:
the resonant element that is an angular velocity sensor;
the semiconductor device according to claim 9 further comprising a detection circuit that detects a sensitivity signal by multiplying a clock signal orthogonal to the output clock signal generated by the PLL circuit by a modulated signal obtained by modulating the resonance signal generated by the angular velocity sensor with the sensitivity signal; and
an arithmetic processing unit that executes predetermined arithmetic processing based on the sensitivity signal output from the detection circuit.

11. The electronic control unit according to claim 10, comprises a controller,
wherein the arithmetic processing unit comprises and arithmetic processor.

12. The PLL circuit according to claim 1, wherein the control unit amplifies a magnitude of the reference clock signal to be supplied to the phase difference detection unit with the amplification factor according to the phase difference.

13. The PLL circuit according to claim 1, further comprising a phase shifter that adds a constant to the phase difference, or subtracts the constant from the phase difference, the phase difference being detected by the phase difference detection unit.

14. The PLL circuit according to claim 1, wherein the phase difference detection unit comprises a phase difference detection circuit, the control voltage generation unit comprises a control voltage generation circuit, the frequency divider comprises a frequency divider circuit, and the control unit comprises a controller.

15. The PLL circuit according to claim 1, wherein the control unit amplifies a magnitude of a received reference clock signal with an amplification factor according to the phase difference information, and outputs the reference clock signal to the digital phase difference detection unit, and
wherein the digital phase difference detection unit compares a phase of the reference clock with a phase of the feedback clock signal and outputs a comparison result as a phase difference information.

16. A control method of a PLL circuit, comprising:
capturing an instantaneous value of a reference clock signal in synchronization with a feedback clock signal, and detecting a phase difference between the reference clock signal and the feedback clock signal based on the captured instantaneous value, the reference clock signal being a digital sine wave;
generating a control voltage according to the phase difference;

generating an output clock signal having a frequency according to the control voltage;

dividing a frequency of the output clock signal to generate the feedback clock signal; and amplifying the reference clock signal with an amplification factor according to the phase difference.

17. The control method of a PLL circuit according to claim 16, wherein the amplifying of the reference clock signal includes amplifying a magnitude of the reference clock signal with an amplification factor according to the phase difference.

18. A PLL device comprising:

a phase difference detection circuit that captures an instantaneous value of a reference clock signal in synchronization with a feedback clock signal, and detects a phase difference between the reference clock signal and the feedback clock signal based on the captured instantaneous value, the reference clock signal being a digital sine wave;

a control voltage generation circuit that generates a control voltage according to the phase difference;

a voltage control oscillator that generates an output clock signal having a frequency according to the control voltage;

a frequency divider circuit that divides a frequency of the output clock signal to generate the feedback clock signal; and a control circuit that amplifies an amplitude of an externally provided input reference clock signal and outputs the reference clock signal to the phase difference detection circuit with an amplification factor according to the phase difference.

19. The PLL circuit according to claim 18, wherein when the phase difference is greater than a first predetermined value, the control circuit amplifies the reference clock signal with an amplification factor greater than that when the phase difference is greater than the first predetermined value.

20. The PLL circuit according to claim 19, wherein when the phase difference is equal to or less than a second predetermined value, the control circuit amplifies the reference clock signal with an amplification factor greater than that when the phase difference is greater than the second predetermined value and equal to or less than the first predetermined value, the second predetermined value being less than the first predetermined value.

* * * * *